United States Patent [19]

Ohsawa

[11] 4,049,918
[45] Sept. 20, 1977

[54] MPX STEREO SIGNAL DEMODULATOR
[75] Inventor: Misuo Ohsawa, Fujisawa, Japan
[73] Assignee: Sony Corporation, Tokyo, Japan
[21] Appl. No.: 731,018
[22] Filed: Oct. 8, 1976
[30] Foreign Application Priority Data
  Oct. 9, 1975  Japan .............................. 50-122276
  Oct. 10, 1975 Japan .............................. 50-122008
[51] Int. Cl.² .............................................. H04H 5/00
[52] U.S. Cl. ............................................... 179/15 BT
[58] Field of Search ................... 179/15 BT, 1 G; 329/122, 123; 325/36

[56] References Cited
U.S. PATENT DOCUMENTS 3,573,382  4/1971  Feit ........................... 179/15 BT
3,842,211  10/1974 Metro ......................... 179/15 BT
3,947,645  3/1976  Mizukami et al. ............. 179/15 BT Primary Examiner—Douglas W. Olms
Attorney, Agent, or Firm—Lewis H. Eslinger; Alvin Sinderbrand

[57] ABSTRACT

A multiplex (MPX) stereo signal demodulator includes a first differential amplifier supplied with a composite stereo signal and second, third differential amplifiers cascode-connected to the first differential amplifier and supplied with a 38 KHz subcarrier signal so as to obtain, by demodulation, a pair of audio signals as the multiplying results of the composite and subcarrier signals. A fourth differential amplifier supplied with the composite stereo signal, the input level of which is adjustable, is provided and the output signal therefrom is mixed with the pair of audio signals through a current mirror circuit so as to compensate the separation ratio therebetween.

11 Claims, 6 Drawing Figures

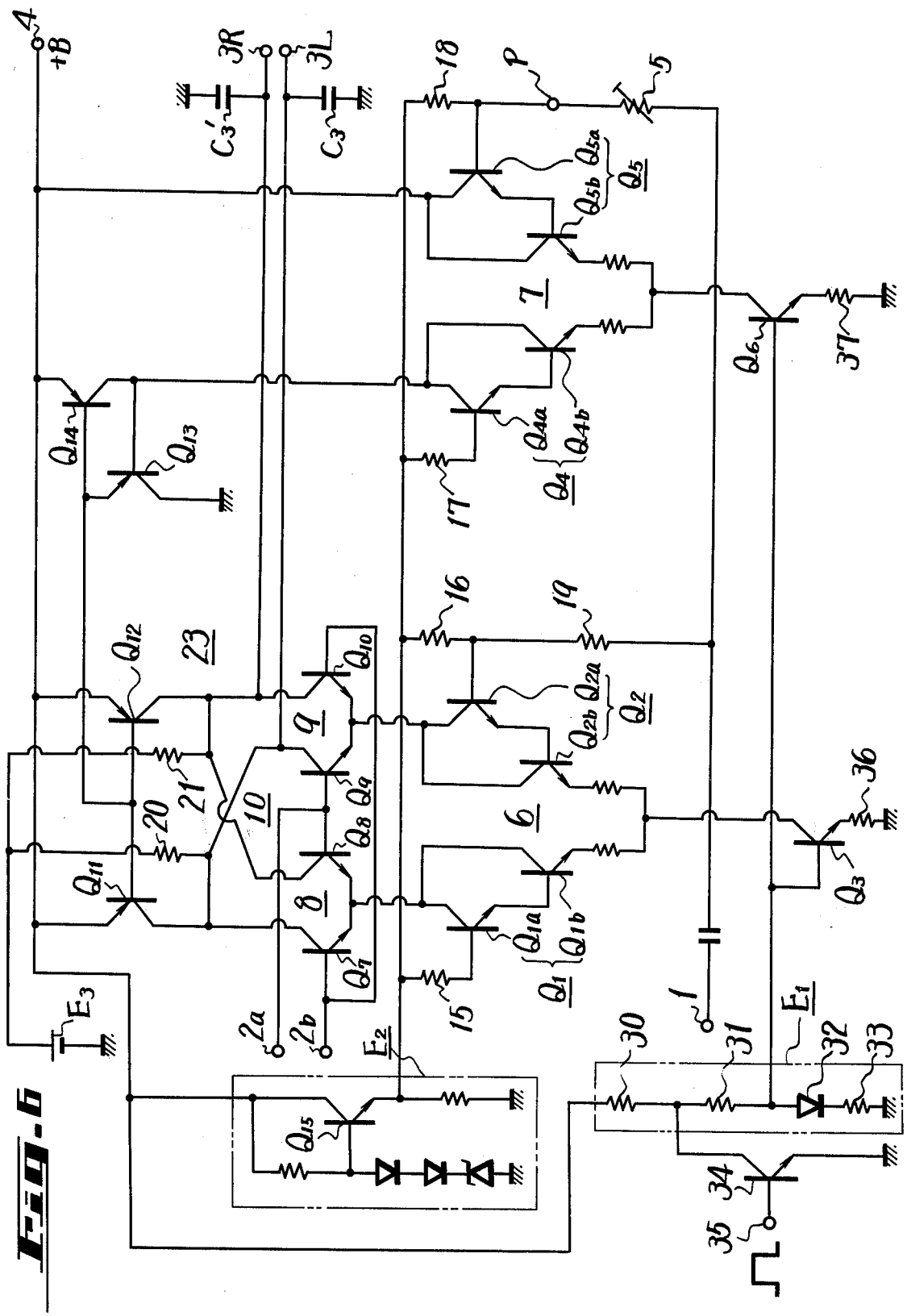

MPX STEREO SIGNAL DEMODULATOR

BACKGROUND OF THE INVENTION

1. Field of the Invention

The present invention relates generally to an MPX stereo signal demodulator, and is directed more specially to an MPX stereo signal demodulator suitable for being made as an integrated circuit (IC).

2. Description of the Prior Art

Product demodulators have been used heretofore to obtain stereo audio signals from a composite stereo signal and a sub-carrier signal. The composite stereo signal, according to the standards used by the industry, includes a low frequency portion not modulated on a carrier and comprising the sum of the left (L) and right (R) electronic signals. This L+R signal extends from the lowest audio frequencies up to approximately 15 KHz. A difference signal L−R is modulated on a 38 KHz carrier by suppressed carrier modulation so that only the two side bands are left. These side bands are added to the low frequency sum signal L+R to form the complete composite stereo signal.

In one form of circuit for separating the L and R components from each other, the composite signal is applied to a differential amplifier that has a variable resistor in series with the emitter circuits of the differentially connected transistors. This variable resistor is connected so that emitter current of both of the transistors flows through the resistor to ground. This variable resistor is used as a separation control for controlling the amount of the L+R sum signal mixed with the demodulated L−R signals.

The demodulated L−R signals are obtained by two other differential amplifiers each of which is connected in series with the collector of a respective one of the differentially connected transistors in the first differential amplifier. The 38 KHz carrier signal is differentially applied to the pair of differential amplifier collector loads to render the transistors in the latter two differential amplifiers alternately conductive. The resultant demodulated L−R and R−L signals are combined with the L−R signal to obtain separated L and R signals at two output terminals of the circuit.

The foregoing prior art circuit has the disadvantage that variation of the resistance of the variable resistor in series with the emitters of both of the differentially connected transistors causes the DC level of the stereo demodulated output signal to fluctuate.

In another type of prior art circuit, there is a generally similar connection of the composite stereo signal to a differential amplifier that has a constant current circuit in the common emitter circuit thereof. Second and third differential amplifiers are connected in the collector circuits of the differentially connected transistors in the first differential amplifier in a manner similar to the previously described prior art circuit. A separate pair of transistors having their input circuit connected in parallel are also connected to receive the composite stereo signal. The variable resistor that operates as a separation control is connected in the common emitter circuits of the parallel connected transistors, and the collectors of the parallel connected transistors are connected to the output terminals of the second and third differential amplifiers to effect a multiplexing operation whereby separated L and R signals are obtained at the two output terminals of the circuit. This circuit still has the disadvantage that the DC level of the stereo modulated output signal fluctuates with variations of the separation control resistor.

Still another prior art circuit utilizes the basic stereo signal demodulator of one of the first two types of circuits but connects the two output signals to separate transistors that have the final output terminals at their collectors. The emitters of this pair of output transistors are connected to ground through separate resistors and are connected together through the variable separation control resistor. Variation of the resistance of the latter resistor does not change the DC level, but it is necessary to provide two IC terminals so that the two ends of the variable resistor can be connected between them. In the two first mentioned circuits, it was only necessary to provide a single IC terminal for connection to one end of the variable resistor. It is well known in IC technology that it is highly desirable to limit the number of terminals required for the IC device.

OBJECTS AND SUMMARY OF THE INVENTION

Accordingly, it is an object of the invention to provide an improved MPX stereo signal demodulator free from the defects of the prior art stereo signal demodulators.

It is another object of the invention to provide an MPX stereo signal demodulator which is suitable for being made as a monolithic IC circuit and has few external terminals.

It is a further object of the invention to provide an MPX stereo signal demodulator with which the DC level of a demodulated output stereo signal does not fluctuate upon the adjustment of the separation control.

It is a still further object of the invention to provide an MPX stereo signal demodulator in which a muting control circuit is provided for eliminating a noise between stations of an FM receiver.

In accordance with an example of the present invention, a multiplex stereo signal demodulator is provided which includes a direct voltage power supply source, a first differential amplifier having at least a pair of transistors and a common emitter impedance connected to a reference voltage point, a second differential amplifier having at least a pair of transistors with their emitters connected to each other and to the collector of one of the transistors of the first differential amplifier, a third differential amplifier having at least a pair of transistors with their emitters connected to each other and to the collector of the other transistor of the first differential amplifier, a coupling circuit for coupling the collector of one of the transistors of the second differential amplifier to the collector of one of the transistors of said third differential amplifier and coupling the collector of the other transistor of said second differential amplifier to the collector of the other transistor of said third differential amplifier, respectively. These connection points define a pair of signal output terminals. The circuit further includes a fourth differential amplifier having at least a pair of transistors and a common emitter impedance connected to the reference voltage point. A current mirror circuit is connected between the direct voltage source and the collector circuits of the second, third and fourth differential amplifiers. Signal input terminals are provided for applying a composite stereo signal to the first and fourth differential amplifiers and for applying a sub-carrier signal to the second and third differential amplifiers, respectively. An amplitude control circuit is provided for varying the composite signal levels applied to the first and fourth differential amplifiers, relatively, so as to adjust separation characteristics between the output signals at the signal output terminals, but without changing the DC level.

Other objects, features and advantages of the invention will become apparent from the following description taken in conjunction with the accompanying drawings.

BRIEF DESCRIPTION OF THE DRAWINGS

FIG. 6 is a connection diagram showing another embodiment of the invention.

DESCRIPTION OF THE PREFERRED EMBODIMENTS

Figure 1:
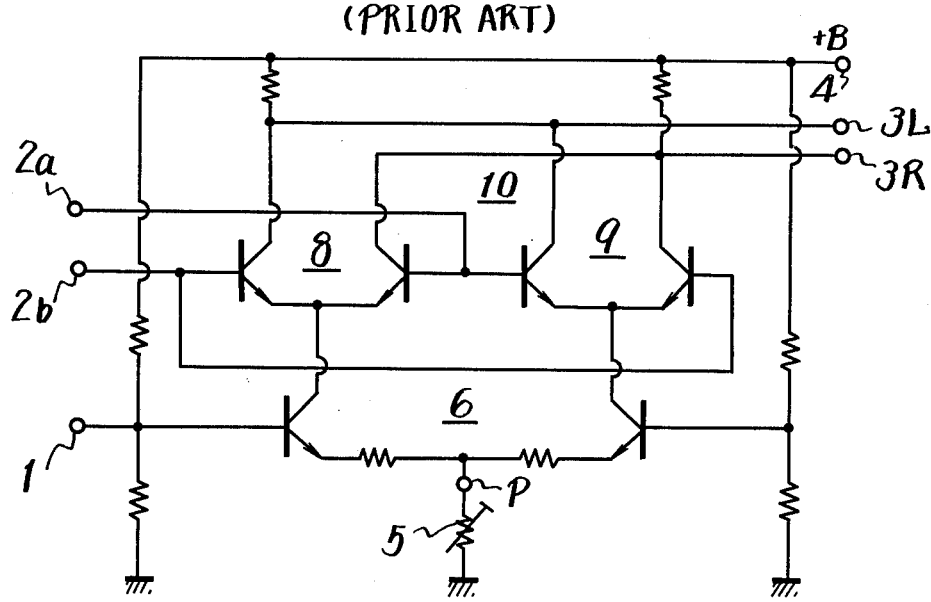
FIGS. 1 to 3 are, respectively, connection diagrams showing prior art MPX stereo signal demodulators, each having a separation control circuit.
Figure 2:
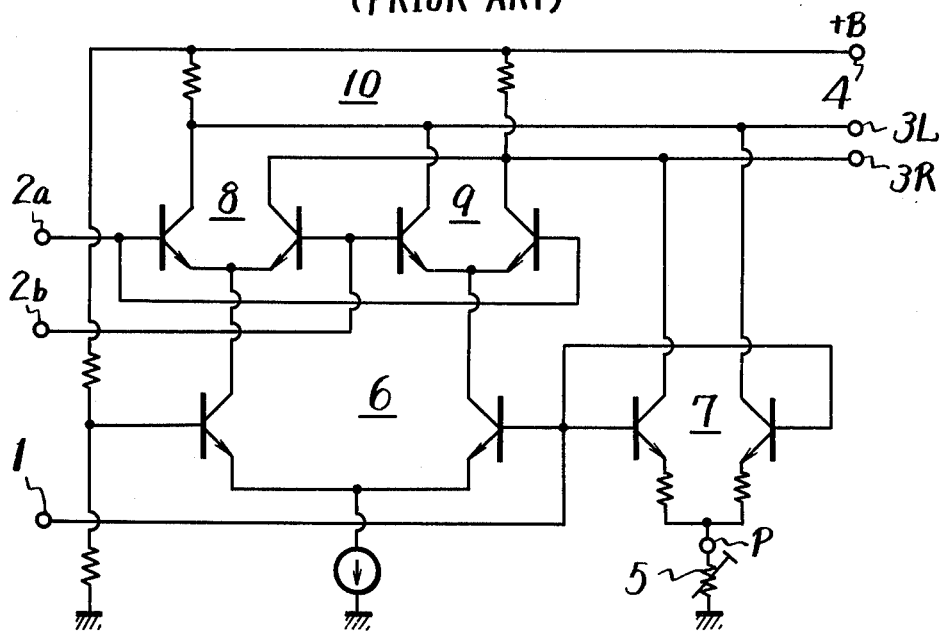
Figure 3:
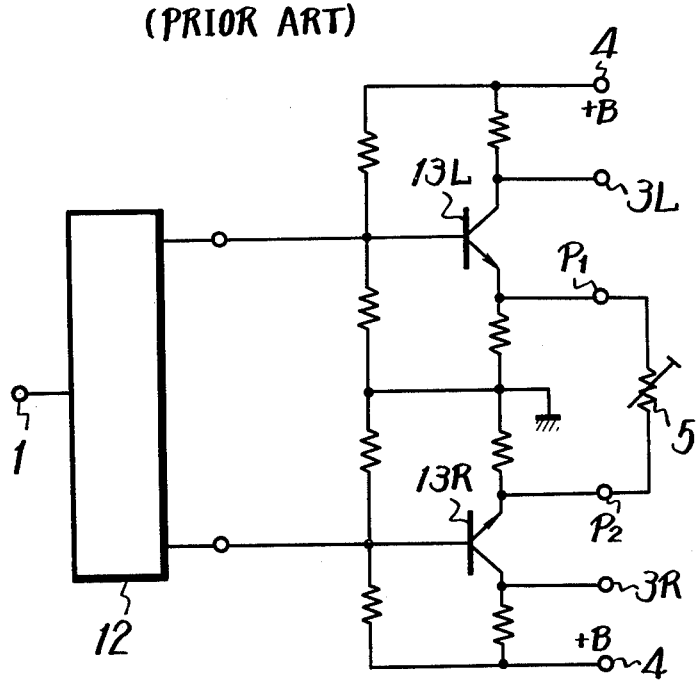

Three prior art examples of a stereo signal demodulator are shown in FIGS. 1 to 3.

A first prior art stereo signal demodulator shown in FIG. 1 has an input terminal 1, which is supplied with a complex or composite stereo signal, and two input terminals 2a and 2b to which are supplied opposite polarity versions of a sub-carrier signal of 38 KHz. The circuit has two signal output terminals 3L and 3R from which separated left and right audio output signals, respectively, are derived as stereo demodulated output signals. A power supply voltage source terminal 4 has a voltage of +B. The terminal 1 is connected to a differential amplifier circuit 6 to supply the composite stereo signal thereto. This differential amplifier circuit 6 includes a pair of differentially connected transistors, the base electrode of one of which is supplied with the composite stereo signal. The circuit also includes a multiplier circuit 10 that consists of a pair of differential amplifier circuits 8 and 9 respectively cascode-connected to the collector electrodes of the transistors forming the differential amplifier circuit 6. The differential amplifier circuits 8 and 9 forming the multiplier circuit 10 are supplied with the sub-carrier signal of 38 KHz as balanced inputs through the input terminals 2a and 2b, respectively. The multiplier circuit 10 is also supplied with the composite stereo signal from the differential amplifier circuit 6. The composite stereo signal and sub-carrier signal are multiplied in the multiplier circuit 10. Thus, at the output terminals 3L and 3R there are obtained stereo demodulated signals, or left and right audio signals, respectively. In practice, though not shown, low pass filters are respectively connected to the output terminals 3L and 3R to eliminate high frequency components of the audio signals.

A variable resistor 5 for separation control is provided in the constant current source circuit of the differential amplifier circuit 6 to adjust the resistance value thereof and to fix the same and hence to control the separation. In FIG. 1, reference letter P designates a terminal to which the variable resistor 5 is connected.

The prior art stereo signal demodulator shown in FIG. 1 is formed as a monolithic integrated circuit (IC), but the variable resistor 5 for separation control is externally connected through the terminal P of the IC to the differential amplifier circuit 6 as the constant current source circuit. By adjusting the variable resistor 5, the gain of the differential amplifier circuit 6 is controlled, and hence the mixing amount of the main audio signal components consisting of a sum signal L+R of the left and right audio signals L and R in the composite stereo signal is varied to carry out the separation control.

While the above-mentioned prior art stereo signal modulator can be formed as a monolithic IC with only a single external terminal for the connection of the separation control variable resistor 5, the circuit has the disadvantage that the DC level of its stereo demodulated output signal fluctuates as the resistor 5 is varied.

FIG. 2 shows another prior art stereo signal demodulator in which the reference numerals and letters that are the same as those in FIG. 1 represent the corresponding elements.

With the second prior art stereo signal demodulator shown in FIG. 2, there is provided a further amplifier circuit 7 in addition to the differential amplifier circuit 6. The amplifier circuit 7 comprises two transistors that have their base electrodes connected in parallel to the input terminal 1 to be supplied with the composite stereo signal. The collectors of the transistors in the circuit 7 are connected, respectively, to the output terminals 3L and 3R to supply the output signal of the circuit 7 to the multiplier circuit 10. In this case, the variable resistor 5 for the separation control is connected to the constant current source circuit of the amplifier circuit 7 through the terminal P.

When the stereo signal demodulator shown in FIG. 2 is a monolithic IC circuit, as in the case of that shown in FIG. 1, the external terminal P is the only one required for the connection of the separation control variable resistor 5. However, the second prior art example is also not free from the disadvantage that the DC level of the stereo modulated output signal fluctuates when the resistor 5 is varied.

The prior art also includes an FM MPX stereo signal demodulator which is provided with a so-called muting circuit that eliminates noise signals while the FM receiver is between stations during the time it is being tuned. In this case, the constant current source circuit for the differential amplifier circuit 6 used in the example of FIG. 2 is made conductive or non-conductive in accordance with the muting control signal. However, when this circuit is made conductive or non-conductive by the muting circuit, the output DC level of the demodulator fluctuates as in the case of varying the separation control 5, and this produces a noise signal.

FIG. 3 shows a third prior art stereo signal demodulator in which the reference numerals and letters that are the same as those used in FIGS. 1 and 2 designate corresponding elements. In the prior art stereo signal demodulator in FIG. 3, after the composite stereo signal fed to the input terminal 1 is demodulated by a stereo demodulator circuit 12, the respective demodulated output signals therefrom are fed to the base electrodes of the transistors 13L and 13R, which are connected as emitter-grounded amplifiers. The emitter electrodes of the transistors 13L and 13R are connected to ground by separate resistors, and the variable resistor 5 for the separation control is connected directly between the emitter electrodes of the transistors 13L and 13R through terminals $P_1$ and $P_2$. The circuit in FIG. 3 is free from the disadvantage of the circuits in FIGS. 1 and 2 that the DC level of the demodulated output signal fluctuates as the resistor 5 is varied. However, when the total circuit shown in FIG. 3 is made as a monolithic IC, two external terminals $P_1$ and $P_2$ are required for the separation control variable resistor 5, which is undesirable.

An embodiment of the MPX stereo signal demodulator according to the present invention will be described hereinafter with reference to FIG. 4 in which the parts or elements corresponding to those used in FIGS. 1 to 3 are identified by the same reference characters and their description will be omitted for the sake of brevity.

Figure 4:
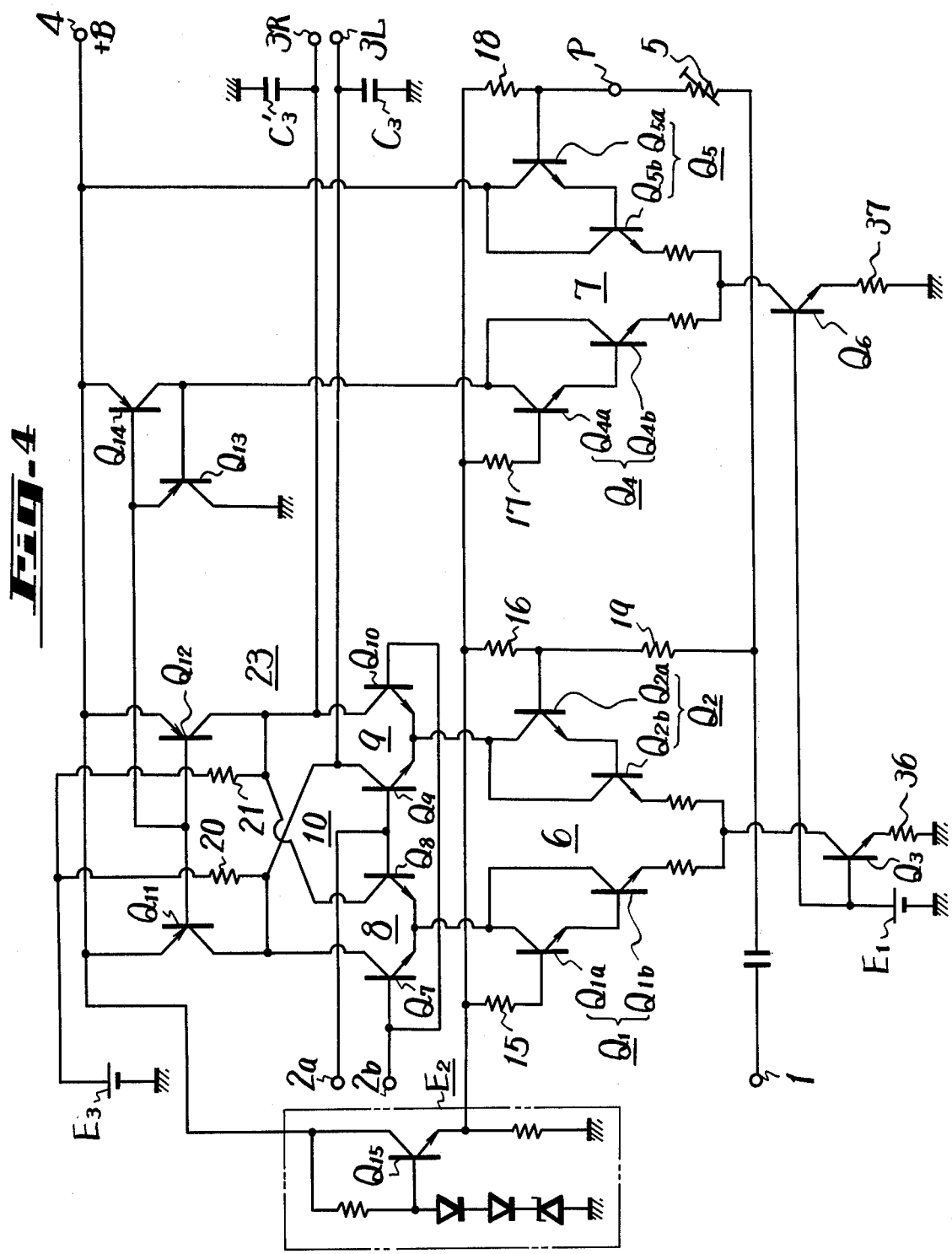
FIG. 4 is a connection diagram showing an embodiment of the MPX stereo signal demodulator according to the present invention.

In the embodiment of the invention shown in FIG. 4, the amplifier circuits 6 and 7 are referred to as first and fourth differential amplifier circuits and are supplied with a complex or composite stereo signal through the input terminal 1. The multiplier circuit 10 is formed of second and third differential amplifier circuits 8 and 9, and the sub-carrier signal with the frequency of 38 KHz is supplied through the input terminals 2a and 2b. The composite stereo signal is supplied to the multiplier circuit 10 from the first differential amplifier circuit 6. These signals are multiplied in the multiplier circuit 10. A current trunk, or current mirror, circuit 23 is also provided. The base electrodes of the respective transistors forming the first and fourth differential amplifier circuits 6 and 7 are supplied with the same direct bias voltage from a direct voltage bias circuit $E_2$ that includes a transistor $Q_{15}$ and are also supplied with the composite stereo signal through the input terminal 1. The variable resistor 5 for separation control is connected through the terminal P to the base electrode of one of the transistors forming the fourth differential amplifier circuit 7.

In detail, the first differential amplifier circuit 6 consists of amplifying transistors $Q_1$, $Q_2$ and a constant current transistor $Q_3$. The amplifying transistor $Q_1$ is formed of transistors $Q_{1a}$ and $Q_{1b}$ connected in a Darlington circuit, and the other amplifying transistor $Q_2$ is formed of transistors $Q_{2a}$ and $Q_{2b}$ that are also connected in a Darlington circuit. The constant current transistor $Q_3$ is supplied with a bias voltage from a bias voltage source $E_1$. The emitter electrode of the transistor $Q_3$ is grounded through a resistor 36.

The fourth differential amplifier circuit 7 consists of amplifying transistors $Q_4$, $Q_5$ and a constant current transistor $Q_6$. The amplifying transistor $Q_4$ is formed of transistors $Q_{4a}$ and $Q_{4b}$ connected in a Darlington circuit, and the other amplifying transistor $Q_5$ is formed of transistors $Q_{5a}$ and $Q_{5b}$ that are also connected in a Darlington circuit. The constant current transistor $Q_6$ is supplied with a bias voltage from the bias voltage source $E_1$. The emitter electrode of the transistor $Q_6$ is grounded through a resistor 37.

The multiplier circuit 10 is formed of the second and third differential amplifier circuits 8 and 9 as described above. The second differential amplifier circuit 8 is formed of a pair of amplifying transistors $Q_7$, $Q_8$ and the transistor $Q_1$, while the third differential amplifier circuit 9 is formed of a pair of amplifying transistors $Q_9$, $Q_{10}$ and the transistor $Q_2$. These second and third differential amplifier circuits 8 and 9 are supplied with sub-carrier signals of 38 KHz from the input terminals 2a and 2b as balanced input signals, respectively. The multiplier circuit 10 is connected to the collector sides of the transistors $Q_1$ and $Q_2$ forming the first differential amplifier circuit 6 in a laminated, or cascode, form. The collector electrodes of the transistors $Q_7$ and $Q_9$ are connected together through a load resistor 20 to a voltage source $E_3$, and the collector electrodes of the transistors $Q_8$ and $Q_{10}$ are connected together through a load resistor 21 to the voltage souce $E_3$, respectively. The load resistors 20 and 21 are selected to have the same resistance value $R_L$. The output terminal 3L for the left sound signal is connected to the connection point between the collector electrodes of the transistors $Q_7$ and $Q_9$, and the output terminal 3R for the right sound signal is connected to the connection point between the collector electrodes of the transistors $Q_8$ and $Q_{10}$, respectively. A capacitor $C_3$, which is connected between the ground and the terminal 3L, and a capacitor $C_3'$, which is connected between the ground and the terminal 3R, serve as filters for eliminating the sub-carrier signal components at these output terminals.

The current trunk, or current mirror, circuit 23 is formed of a pair of PNP transistors $Q_{11}$ and $Q_{12}$, which are connected to the collectors of the respective transistors of the second and third differential amplifier circuits 8 and 9 forming the multiplier circuit 10 in cascode, and of PNP transistors $Q_{13}$ and $Q_{14}$, which are connected to the collector side of the transistor $Q_4$ of the fourth differential amplifier circuit 7. The connection point between the collector electrodes of the transistors $Q_7$ and $Q_9$ is connected to the collector electrode of the transistor $Q_{11}$, the emitter electrode of which is connected to the voltage source terminal 4. The connection point between the collector electrodes of the transistors $Q_8$ and $Q_{10}$ is connected to the collector electrode of the transistor $Q_{12}$, the emitter electrode of which is connected to the same voltage source terminal 4. The collector electrode of the transistor $Q_4$ or $Q_{4a}$ is connected to the collector electrode of the transistor $Q_{14}$ and to the base electrode of the transistor $Q_{13}$, and the emitter electrode of the transistor $Q_{14}$ is connected to the voltage source terminal 4. The collector electrode of the transistor $Q_{13}$ is grounded, and emitter electrode of the transistor $Q_{13}$ is connected to the base electrode of the transistor $Q_{14}$ and to the base electrodes of the transistors $Q_{11}$ and $Q_{12}$. Thus, a current based upon the composite stereo signal flowing through the collector-emitter circuit of the transistor $Q_{14}$ is relayed to the transistors $Q_{11}$ and $Q_{12}$, respectively.

The transistors $Q_1$, $Q_2$, $Q_4$ and $Q_5$ of the first and fourth differential amplifier circuits 6 and 7 are supplied with the same bias voltage from the bias voltage source $E_2$, which is a constant voltage source, through resistors 15, 16, 17 and 18 which are selected to have equal resistance values. The composite stereo signal supplied to the input terminal 1 is fed to the base electrode of the transistor $Q_2$ or $Q_{2a}$ of the first differential amplifier circuit 6 through a resistor 19 and also to the base electrode of the transistor $Q_5$ or $Q_{5a}$ of the fourth differential amplifier circuit 7 through the variable resistor 5 for the separation control. The base of the transistor $Q_{2a}$ is another input terminal of the IC.

The operation of the MPX stereo signal demodulator of the embodiment shown in FIG. 4 will be described with its equivalent circuit shown in FIG. 5 in which the parts corresponding to those of FIG. 4 are marked with the same reference characters. The description of those parts will be omitted.

Figure 5:
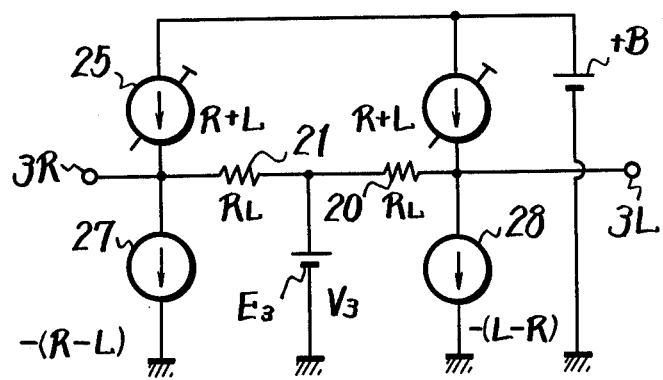
FIG. 5 shows an equivalent circuit of the demodulator shown in FIG. 4 which is used for the explanation thereof.

FIG. 5 includes current sources 27 and 28 for multiplied output signals $-(R-L)$ and $-(L-R)$ from the multiplier circuit 10 and current sources 25 and 26 for the main sound signal $(R+L)$ in the composite stereo signal from the fourth differential amplifier circuit 7. In this case, the left sound signal, which is a sum of currents from the current sources 26 and 28, is derived from the output terminal 3L, while the right sound signal, which is a sum of currents from the current sources 25 and 27, is derived from the outut terminal 3R.

If the variable resistor 5 for the separation control is adjusted, the input level of the composite stereo signal supplied to the fourth differential amplifier circuit 7 can be varied to carry out the separation control. In this case, since the base potentials of the transistors $Q_2$ and $Q_5$ of the first and fourth differential amplifier circuits 6 and 7 which are supplied with the composite stereo signal are entirely the same, no direct current flows through the resistors 19 and 5 regardless of the adjustment of resistor 5, and accordingly the DC levels of the demodulated output signals delivered to the output terminals 3L and 3R are not varied.

Another embodiment of the present invention will be described with reference to FIG. 6 in which the elements corresponding to those of FIG. 4 are marked with the same numerals and their description will be omitted.

In the example shown in FIG. 6, a muting circuit is included to eliminate noise signals produced at those times during the tuning operation of an FM receiver when the receiver is tuned to frequencies between stations. The bias voltage source $E_1$ for the constant current source transistors $Q_3$ and $Q_6$ of the first and fourth differential amplifier circuits 6 and 7 is formed of a series connection of resistors 30 and 31, a diode 32, and a resistor 33 connected in series in that order between the voltage source 4 and ground. The connection point between the resistor 31 and the diode 32 is connected to the base electrodes of the transistors $Q_3$ and $Q_6$. In this embodiment the resistance values of the resistor 33, the resistor 36 connected between the emitter electrode of the transistor $Q_3$ and ground, and the resistor 37 connected between the emitter electrode of the transistor $Q_6$ and ground are equal and the forward voltage drop across the diode 32 is equal to the base-emitter voltages of the transistors $Q_3$ and $Q_6$.

A transistor 34 is designated as a muting circuit. The collector electrode of the transistor 34 is connected to the connection point between the resistors 30 and 31, and the emitter electrode is grounded. An input terminal 35 connected to the base electrode of the transistor 34 receives a muting control signal. In a manner which is not shown but which is similar to the prior art, there is provided a circuit that produces an output signal as the muting control signal when the intermediate frequency signal from an FM intermediate frequency amplifier is amplitude-detected and this detected output signal is lower than a predetermined level.

When the level of the received signal is lower than a predetermined level, the transistor 34 becomes conductive and the voltage of the voltage source $E_1$ becomes zero. The constant current transistors $Q_3$ and $Q_6$ for the first and fourth differential amplifier circuits 6 and 7 therefore become non-conductive and hence the current flowing therethrough becomes zero, but the direct voltage at the output terminals 3L and 3R are held at the value of the voltage source $E_3$. Accordingly, these differential amplifier circuits 6 and 7 stop their operation and the stereo demodulated output signals are not obtained at the output terminals 3L and 3R, respectively. At the same time, muting with no DC fluctuation for noise signals between stations can be achieved upon switching.

The MPX stereo signal demodulator according to the present invention has the first and fourth differential amplifier circuits which are supplied with the composite stereo signal, respectively, and the multiplier circuits which are formed of the second and third differential amplifier circuits and supplied with the sub-carrier signal and the composite stereo signal from the first differential amplifier circuit. The two multiplied output signals opposite in polarity from the multiplier circuit are added to the composite stereo signal from the fourth differential amplifier circuit to be the stereo demodulated output signal. The base electrodes of the transistors forming the first and fourth differential amplifier circuits are supplied with the same bias voltage and with the composite stereo signal, and the base electrode of one of the transistors of the fourth differential amplifier circuit, which base electrode is supplied with the composite stereo signal, is connected with the separation control variable resistor. In this case, even if the separation control variable resistor is adjusted, the DC level of the stereo signal demodulator of the invention does not fluctuate. Further, when the stereo signal demodulator of the invention is made as an IC, only one external terminal is sufficient for the connection of the separation control variable resistor, which is advantageous in view of the desiderata of IC construction.

The stereo signal demodulator of the present invention further includes the muting control means or circuit for making the current flowing in the respective transistors of the first and fourth differential amplifier circuits substantially zero. Two multiplied output signals opposite in polarity from the multiplier circuit are added to the composite stereo signal from the fourth differential amplifier circuit to be the stereo demodulated signal, and by controlling the muting control circuit upon muting, the stereo demodulated output signal is prevented from being derived, so that the direct voltage level of the stereo demodulated output signal does not fluctuate but the gain of the amplifier circuits is changed only upon entering to and coming out of the muting condition. Therefore, less noise is produced at such times.

It will be apparent that many modifications and variations could be effected by those skilled in the art without departing from the spirit or scope of he novel concepts of the present invention, so that the true scope of the invention is to be determined only by the following claims.

What is claimed is:

1. An MPX stereo signal demodulator comprising:
   A. a direct voltage source;
   B. a first differential amplifier including at least a first pair of transistors and a common emitter impedance connected to a reference voltage point;
   C. a second differential amplifier including at least a second pair of transistors with the emitters thereof connected to each other and to the collector of one of the transistors of said first differential amplifier;
   D. a third differential amplifier including at least a third pair of transistors with the emitters thereof connected to each other and to the collector of the other transistor of said first differential amplifier;
   E. coupling circuit means for coupling the collector of one of the transistors of said second differential amplifier to a first connection point comprising the collector of one of the transistors of said third differential amplifier and coupling the collector of the other transistor of said second differential amplifier to a second connection point comprising the collector of the other transistor of said third differential amplifier, respectively, said connection point comprising a pair of signal output terminals;

F. a fourth differential amplifier including at least a fourth pair of transistors and a common emitter impedance connected to the reference voltage point;

G. current mirror circuit means connected between said direct voltage source and collector circuits of said second, third and fourth differential amplifiers;

H. signal input means for applying a composite stereo signal to said first and fourth differential amplifiers and for applying a subcarrier signal to said second and third differential amplifiers, respectively; and I. means for varying the composite signal levels applied to said first and fourth differential amplifiers, relatively, so as to adjust separation characteristics between the output signals at said signal output terminals.

2. An MPX stereo signal demodulator according to claim 1, further comprising first direct voltage biasing means connected to provide the same direct biasing voltage to the bases of the transistors of said first and fourth differential amplifiers.

3. An MPX stereo signal demodulator according to claim 2, further comprising second direct voltage biasing means; and a pair of load impedances connected between said signal output terminals and said second direct voltage biasing means, said second direct voltage biasing means being connected between the reference voltage point and the connection point of said pair of load impedances.

4. An MPX stereo signal demodulator according to claim 3 comprising a third direct voltage biasing means, said first differential amplifier comprising first, second and third transistors and said fourth differential amplifier comprising fourth, fifth and sixth transistors, each of said third and sixth transistors forming a common emitter impedance, respectively, the bases thereof being connected to said third DC biasing means to be equally biased thereby.

5. An MPX stereo signal demodulator according to claim 4, in which said second differential amplifier comprises seventh and eighth transistors and said third differential amplifier comprises ninth and tenth transistors, both collectors of said seventh and ninth transistors being connected to each other, and both collectors of said eighth and tenth transistors being connected to each other.

6. An MPX stereo signal demodulator according to claim 5, in which said current mirror circuit means comprises:

A. an eleventh transistor with the emitter connected to said direct voltage source and the collector connected to the connection point of collectors of said seventh and ninth transistors;

B. a twelfth transistor with the emitter connected to said direct voltage source and the collector connected to the connection point of collectors of said eighth and tenth transistors;

C. a thirteenth transistor, the bases of said eleventh and twelfth transistors being connected to each other and to an emitter of the thirteenth transistor, the collector of the thirteenth transistor connected to the reference voltage point; and D. a fourteenth transistor having its emitter connected to said direct voltage source and its collector connected to the collector of said fourth transistor and the base of said thirteenth transistor, and the base of the fourteenth transistor being connected to the emitter of said thirteenth transistor.

7. An MPX stereo signal demodulator according to claim 6, in which said first direct voltage biasing circuit comprises:

A. a fifteenth transistor with the collector thereof connected to said direct voltage source;

B. a first resistor connecting the emitter of the fifteenth transistor to the reference voltage point;

C. a second resistor connecting the base of said fifteenth transistor to said direct voltage source; and D. a series connection comprising at least one diode and a Zener diode connected between the base of said fifteenth transistor and the reference voltage point.

8. An MPX stereo signal demodulator according to claim 7 comprising third, fourth, fifth and sixth resistors of equal resistance values, each of the bases of said first, second, fourth and fifth transistors being connected to the emitter of said fifteenth transistor through said third, fourth, fifth, and sixth resistors, respectively.

9. An MPX stereo signal demodulator according to claim 8 comprising a fixed resistor and a variable resistor, said signal input means being connected to the base of one of the transistors of said first differential amplifier to supply the composite stereo signal thereto through said fixed resistor, and said signal input means being connected to the base of one of the transistors of said fourth differential amplifier to supply the same composite stereo signal thereto through said variable resistor.

10. An MPX stereo signal demodulator according to claim 9, in which each of said first, second, fourth and fifth transistors comprises Darlington-connected pair of transistors.

11. An MPX stereo signal demodulator according to claim 3, further including muting control circuit means.

* * * * *